United States Patent
Gauthier, Jr. et al.

(10) Patent No.: US 8,373,267 B2
(45) Date of Patent: Feb. 12, 2013

(54) ELECTROSTATIC DISCHARGE (ESD) SILICON CONTROLLED RECTIFIER (SCR) STRUCTURE

(75) Inventors: Robert J. Gauthier, Jr., Hinesburg, VT (US); Junjun Li, Williston, VT (US); Ankit Srivastava, Champaign, IL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/196,404

(22) Filed: Aug. 2, 2011

(65) Prior Publication Data

US 2011/0284925 A1 Nov. 24, 2011

Related U.S. Application Data

(63) Continuation of application No. 12/342,228, filed on Dec. 23, 2008, now Pat. No. 8,039,868.

(51) Int. Cl.
*H01L 29/66* (2006.01)
*H01L 23/62* (2006.01)

(52) U.S. Cl. .. 257/713; 257/174; 257/362; 257/E29.181

(58) Field of Classification Search .................. 257/173, 257/174, 362, E29.181; 438/134
See application file for complete search history.

(56) References Cited

U.S. PATENT DOCUMENTS

| | | | |
|---|---|---|---|
| 5,780,905 A | 7/1998 | Chen et al. | |
| 6,011,681 A | 1/2000 | Ker et al. | |
| 6,188,088 B1 | 2/2001 | Ramakrishnan | |
| 6,208,195 B1 | 3/2001 | Wyland | |
| 6,215,350 B1 | 4/2001 | Wyland | |
| 6,258,634 B1 | 7/2001 | Wang et al. | |
| 6,353,237 B1* | 3/2002 | Yu | 257/173 |
| 6,556,063 B2 | 4/2003 | Wyland | |
| 6,784,029 B1 | 8/2004 | Vashchenko et al. | |
| 6,933,540 B2 | 8/2005 | Liu et al. | |
| 6,964,883 B2 | 11/2005 | Chang | |
| 7,023,029 B1 | 4/2006 | Vashchenko et al. | |
| 7,087,968 B1 | 8/2006 | Lai et al. | |
| 7,098,509 B2 | 8/2006 | Zdebel et al. | |
| 7,285,828 B2 | 10/2007 | Salcedo et al. | |
| 7,405,435 B2* | 7/2008 | Sato | 257/173 |
| 7,479,414 B2 | 1/2009 | Salcedo et al. | |
| 7,986,502 B2* | 7/2011 | Sorgeloos | 361/56 |
| 2003/0035257 A1* | 2/2003 | Chen | 361/56 |
| 2004/0089909 A1 | 5/2004 | Lee et al. | |
| 2006/0043487 A1 | 3/2006 | Pauletti et al. | |
| 2006/0097321 A1 | 5/2006 | Kim | |
| 2007/0007545 A1 | 1/2007 | Salcedo et al. | |
| 2007/0058307 A1 | 3/2007 | Mergens et al. | |
| 2008/0029782 A1 | 2/2008 | Carpenter et al. | |
| 2009/0230426 A1 | 9/2009 | Carpenter et al. | |
| 2009/0261378 A1 | 10/2009 | Salcedo et al. | |
| 2009/0273868 A1 | 11/2009 | Liu et al. | |
| 2010/0264457 A1* | 10/2010 | Sorgeloos et al. | 257/173 |
| 2011/0032647 A1 | 2/2011 | Kawachi | |
| 2012/0218671 A1* | 8/2012 | Domanski et al. | 361/56 |

FOREIGN PATENT DOCUMENTS

WO 2006036447 4/2006

\* cited by examiner

*Primary Examiner* — Ngan Ngo

(74) *Attorney, Agent, or Firm* — Anthony Canale; Roberts Mlotkowski Safran & Cole, P.C.

(57) ABSTRACT

A structure includes first and second silicon controlled rectifiers (SCRs) formed in a substrate. The first and the second SCRs each include at least one component commonly shared between the first and the second SCRs.

4 Claims, 16 Drawing Sheets

ELECTROSTATIC DISCHARGE (ESD) SILICON CONTROLLED RECTIFIER (SCR) STRUCTURE

CROSS REFERENCE TO RELATED APPLICATIONS

The present application is a continuation application of U.S. application Ser. No. 12/342,228, filed on Dec. 23, 2008, the contents of which are incorporated by reference in their entirety herein.

FIELD OF THE INVENTION

The present invention generally relates to a design structure and method of manufacturing a circuit, and more specifically to a design structure and method for an electrostatic discharge (ESD) silicon controlled rectifier (SCR) structure.

BACKGROUND OF THE INVENTION

An ESD event refers to a phenomenon of electrical discharge of a current (positive or negative) for a short duration during which a large amount of current is provided to an integrated circuit (IC). The large current may be built-up from a variety of sources, such as the human body. An ESD event commonly results from the discharge of a high voltage potential (typically, several kilovolts) and leads to pulses of high current (several amperes) of a short duration (typically, 1 nanosecond to 1000 nanoseconds). An ESD event is generated within an IC, illustratively, by human contact with the leads of the IC or by electrically charged machinery being discharged in other leads of an IC. During installation of integrated circuits into products, these electrostatic discharges may destroy the IC and thus require expensive repairs on the products, which could have been avoided by providing a mechanism for dissipation of the electrostatic discharge to which the IC may have been subjected.

Manufacturers and users of ICs must take precautions to avoid ESD. For example, ESD prevention can be part of the device itself and may include special design techniques for device input and output pins. Additionally, external protection components can also be used with circuit layout. For example, to protect ICs from an ESD event, many schemes have been implemented, including use of a silicon controlled rectifier (SCR). An SCR can sustain high currents, hold the voltage across the SCR at a low level and may be implemented to bypass high current discharges associated with an ESD event.

Thus, an SCR device may be the proper ESD solution for high speed differential inputs and outputs (IOs). For example, an SCR typically provides less capacitive loading as compared to a diode. Additionally, an SCR provides better ESD protection as compared to a string diode.

However, size constraints may also be an issue when using SCRs for high-speed differential IOs. For example, two separate diode-triggered SCRs on differential pads take up a large area on the device. In contrast, a compact SCR make take forty percent less area than two separate SCRs.

Accordingly, there exists a need in the art to overcome the deficiencies and limitations described hereinabove.

SUMMARY OF THE INVENTION

In a first aspect of the invention, a bi-directional electrostatic discharge (ESD) structure comprises a substrate and first and second silicon controlled rectifiers (SCRs) formed in the substrate. Further, the first and the second SCRs each comprise at least one component commonly shared between the first and the second SCRs.

In an additional aspect of the invention, a method comprises forming a substrate and forming first and second silicon controlled rectifiers (SCRs) in the substrate. Furthermore, the first and the second SCRs each comprise at least one component commonly shared between the first and the second SCRs.

In a further aspect of the invention a diode-triggered dual silicon controlled rectifier (SCR) electrostatic discharge (ESD) structure comprises a substrate and a diode string trigger network. Additionally, the structure comprises first and second silicon controlled rectifiers (SCRs) formed in the substrate, wherein the first and the second SCRs each comprise at least one component commonly shared between the first and the second SCRs. Moreover, the at least one commonly shared component comprises at least one of an NPN collector, a PNP base and the diode string trigger network.

In an additional aspect of the invention, a design structure is embodied in a machine readable medium for designing, manufacturing, or testing a design. The design structure comprises a substrate and first and second silicon controlled rectifiers (SCRs) formed in the substrate. Additionally, the first and the second SCRs each comprise at least one component commonly shared between the first and the second SCRs.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention generally relates to a design structure and method of manufacturing a circuit, and more specifically to a design structure and method for an electrostatic discharge (ESD) silicon controlled rectifier (SCR) structure. By implementing the invention, an ESD SCR may be used for protection of any two pads, such as the two I/O pads of a differential driver/receiver circuit, while minimizing the area of the device necessary for the placement of the SCR structure. Moreover, the SCR structure provides very low capacitance loading and robust ESD performance, e.g., low holding voltage and scalable on-resistance. While in the following description, a differential driver/receiver circuit will be used as an example for the implementation of the invention, the invention contemplates other implementations, and is not limited to differential driver/receiver circuits.

Figure 1:
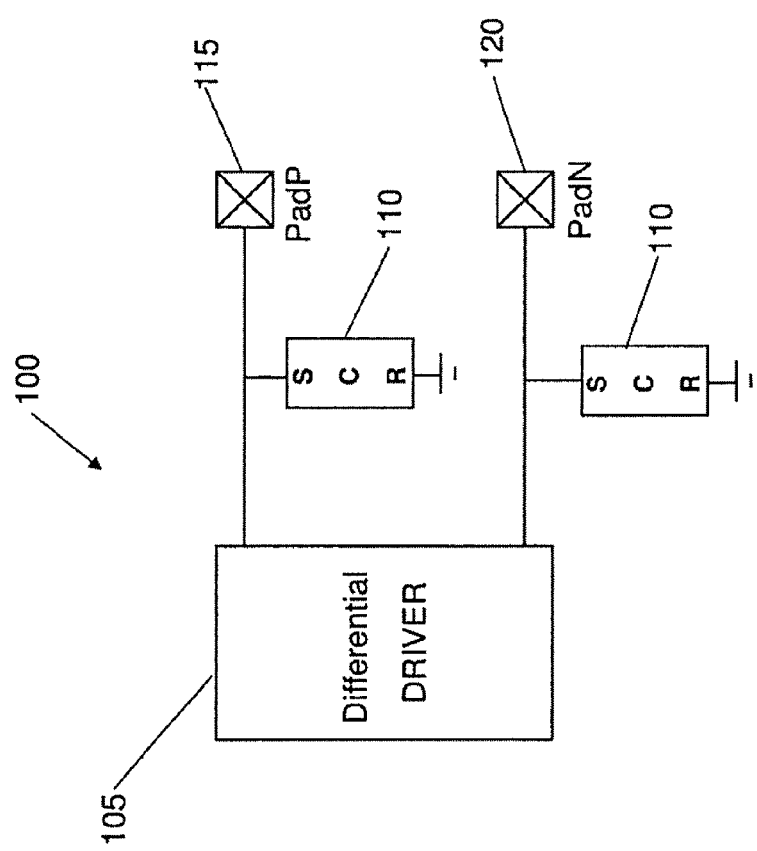
FIG. 1 shows an SCR enabled ESD protection device for an integrated circuit with two pads, such as the two output pads of a differential driver.

FIG. 1 illustrates a schematic of a circuit 100, which includes an SCR enabled ESD protection device for a differential driver (or receiver). A differential input/output circuit, e.g., a differential driver or receiver circuit, uses differential input from two pads, wherein the difference in potential between the two pads is transferred to internal core circuitry. More specifically, FIG. 1 shows a differential driver (or receiver) 105 connected between differential pad PadP 115 (e.g., a positive output pad) and differential pad PadN 120 (e.g., a negative output pad). Additionally, an SCR 110 is connected between the differential driver (or receiver) 105 and each of the differential pads PadP 115 and PadN 120. As should be understood, in the event of an ESD, the SCRs 110 will shunt the ESD current to ground to protect the differential driver (or receiver) 105. However, with the conventional SCR enabled ESD protection for the differential driver of FIG. 1, two completely separate SCR devices are utilized, thus requiring more device area.

Figure 2:
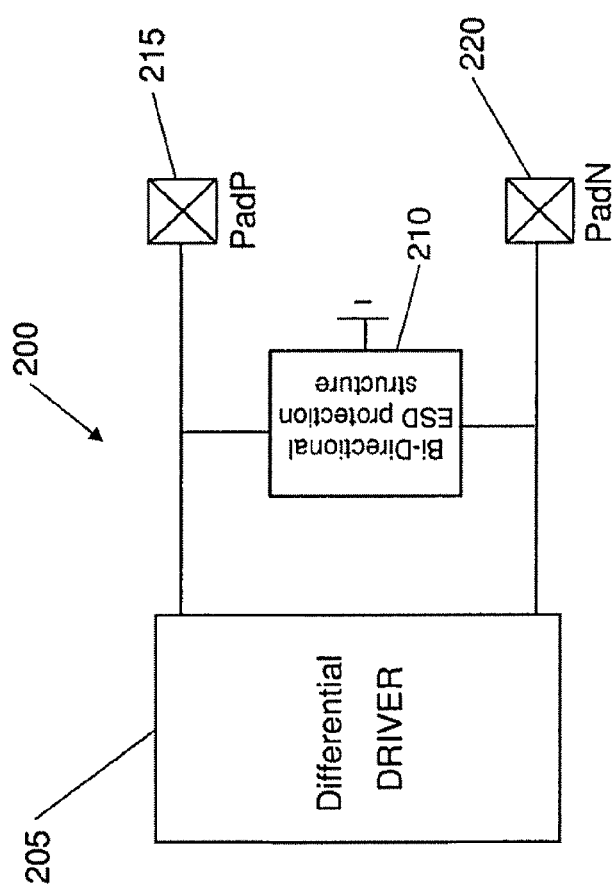
FIG. 2 shows a schematic depiction of a bidirectional SCR enabled ESD protection device for a differential driver according to an aspect of the invention.

FIG. 2 shows a schematic of an SCR ESD protection device 200 for a differential driver according to an aspect of the present invention. As shown in FIG. 2, a differential driver (or receiver) 205 is connected between differential pad PadP 215 (e.g., an positive output pad) and differential pad PadN 220 (e.g., an negative output pad). Additionally, a bi-directional ESD protection structure 210 comprising SCRs is connected between the lines from the differential driver (or receiver) 205 and each of the differential pads PadP 215 and PadN 220. Thus, as shown in FIG. 2, a single bi-directional structure 210 comprising dual SCR devices may be used as an ESD protection device, which requires less device space. As should be understood, typically the differential pads 215 and 220 are close to each other.

With the occurrence of an ESD event, the dual SCR device 200 directs the discharge current during the ESD through the bi-directional SCR 210 to ground and away from the protected differential driver (or receiver) 205. More specifically, in operation, in the normal "off" state the bi-directional SCR 210 restricts current flow to the leakage current. When, for example, the anode to N-body or the P-body to cathode voltage exceeds a certain threshold, the bi-directional SCR 210 turns "on" and conducts current to ground. The bi-directional SCR 210 will remain in the "on" state even after the trigger current is removed so long as current through the bi-directional SCR 210 remains above the holding current. Thus, in this way, the bi-directional SCR 210 redirects current, e.g., from an ESD event, away from the devices being protected, e.g., the differential driver (or receiver) 205 and shunts the current to ground, such that the protected device is not damaged by the ESD event.

Figure 3:
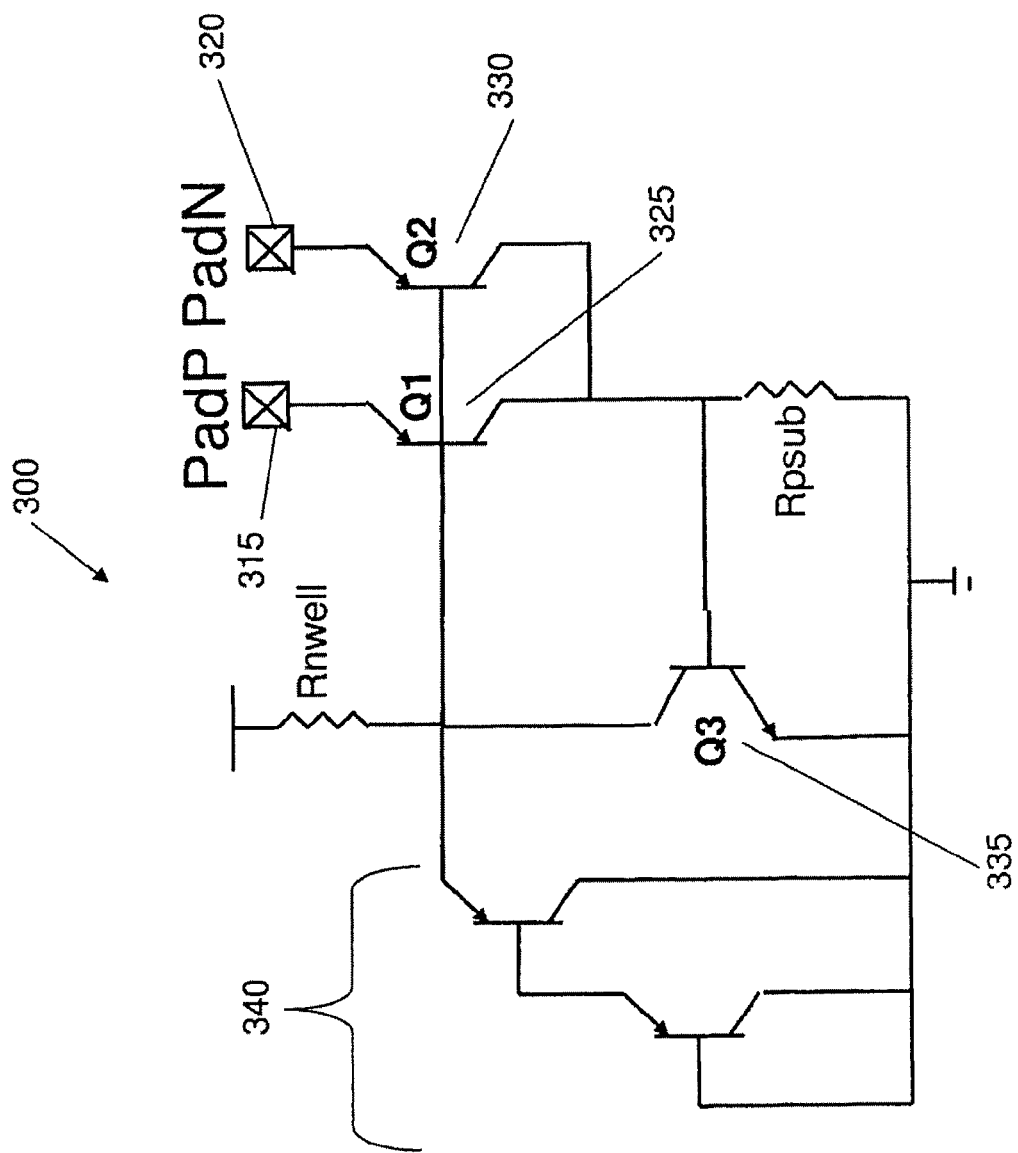
FIG. 3 shows an exemplary schematic of a diode-triggered dual SCR structure according to an aspect of the invention.

FIG. 3 shows a schematic of a diode-triggered dual SCR device 300 according to an aspect of the invention. As shown in FIG. 3, the diode-triggered dual SCR includes a first PNP transistor 325 (Q1), a second PNP transistor 330 (Q2) and an NPN transistor 335 (Q3). Additionally, the diode-triggered dual SCR device 300 includes a trigger diode network 340 comprising, e.g., a plurality of PNP transistors. As shown in FIG. 3, a first SCR is formed with the first PNP transistor 325 (Q1) and an NPN transistor 335 (Q3) and a second SCR is formed with the second PNP transistor 330 (Q2) and the NPN transistor 335 (Q3).

Figure 4:
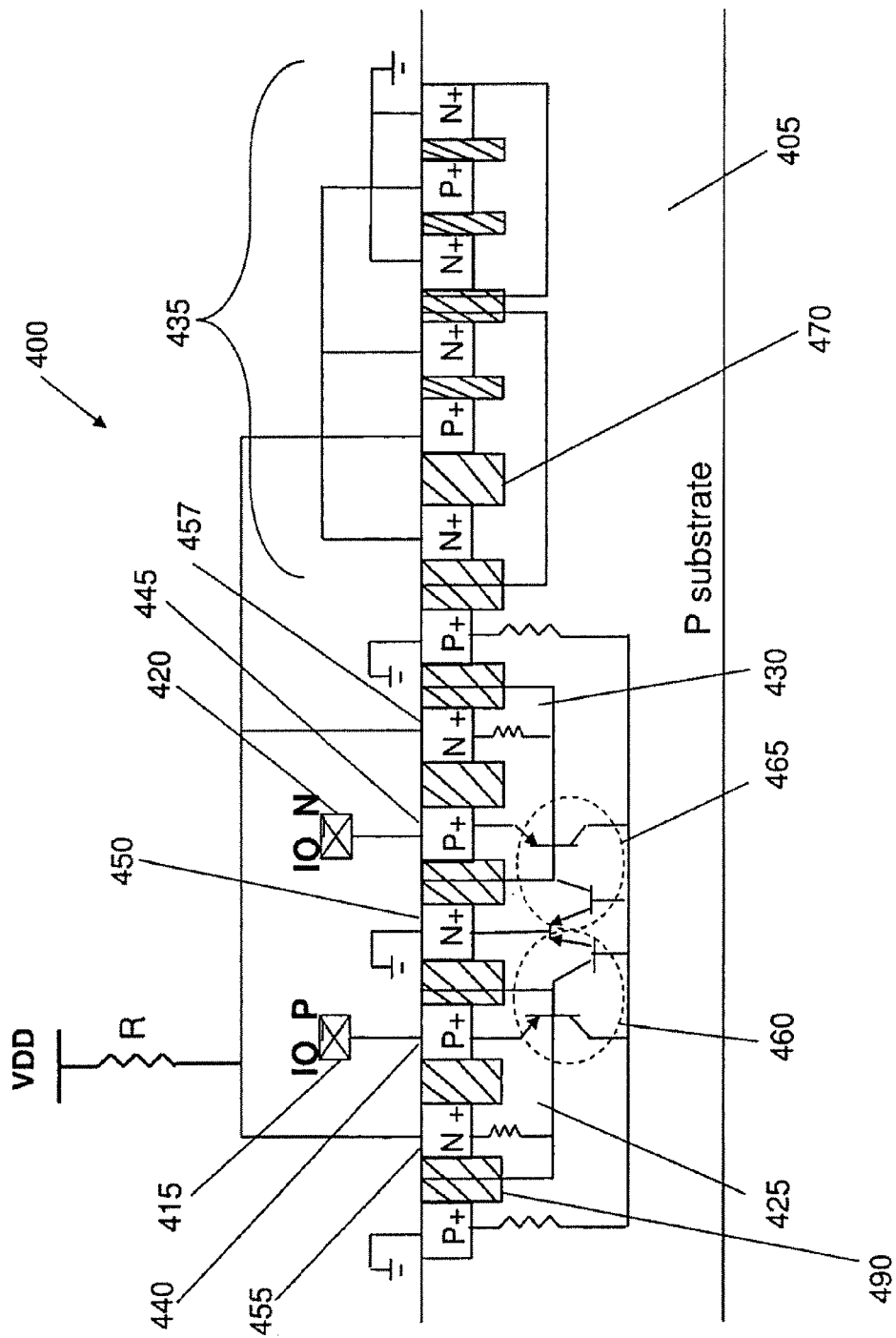
FIG. 4 shows an exemplary cross section view of a diode-triggered dual SCR structure according to an aspect of the invention.

FIG. 4 shows an exemplary dual SCR cross section view 400 of the diode-triggered dual SCR device schematic 300 of FIG. 3 according to an aspect of the invention. As shown in FIG. 4, a dual SCR structure 400 is formed in a lightly-doped, e.g., P-type substrate 405. A first SCR 460 includes an N-well 425 formed in the substrate 405. Moreover, an N+ region 455 and P+ region 440 are formed in the N-well 425 and an N+ region 450 is formed in the P-type substrate 405. As should be understood by one skilled in the art, the P+ region 440 (emitter), the N-well 425 (base) and the P-type substrate 405 (collector) form the PNP transistor and the N+ region 450 (emitter), the P-type substrate 405 (base) and the N-well 425 (collector) form the NPN transistor of the first SCR. Thus, together the NPN transistor and the PNP transistor form the PNPN structure of the SCR 460.

Additionally, a second SCR 465 includes an N-well 430 formed in the substrate 405. Moreover, an N+ region 457 and P+ region 445 are formed in the N-well 430. As should be understood by one skilled in the art, the P+ region 445 (emitter), the N-well 430 (base) and the P-type substrate 405 (collector) form the PNP transistor of the second SCR 465 and the N+ region 450 (emitter), the P-type substrate 405 (base) and the N-well 430 (collector) form the NPN transistor of the second SCR 465. Thus, together the NPN transistor and the PNP transistor form the PNPN structure of the SCR 465.

A diode string 435 is also formed in the P-type substrate 405 for triggering the SCRs 460 and 465. As shown in FIG. 4, the first SCR 460 and the second SCR 465 are both electrically-connected to the diode string 435. Additionally, shallow trench isolations (STIs) 490 may be formed between each of the plurality of P+ regions and N+ regions in a conventional manner to electrically isolate the adjacent regions from one another. That is, STIs 490 may be provided by locally etching trenches into the silicon film layer. In particular, trenches are etched in specific areas, an insulator material, e.g., silicon dioxide ($SiO_2$), is illustratively deposited, and the surface is then planarized. The portion of the silicon layer not filled by the STI insulator material is utilized to deploy an active region in which the active transistors and devices are formed. Typically, the STIs 490 are used to separate regions that will receive high doping. The high doped regions may also be separated by other techniques known in the art, which are beneficial to the SCR operation.

Thus, as shown in the embodiment of FIG. 4, while the first SCR 460 and the second SCR 465 each have their own respective P+ regions and N-wells, the first SCR 460 and the second SCR 465 each share the same N+ region 450 (emitter) and the same P-type substrate 405 (base). Additionally, the first SCR 460 and the second SCR 465 each share the diode string 435. Thus, with the exemplary embodiment of FIG. 4, by sharing common components, a dual SCR layout may be obtained utilizing less device space.

Figure 5:
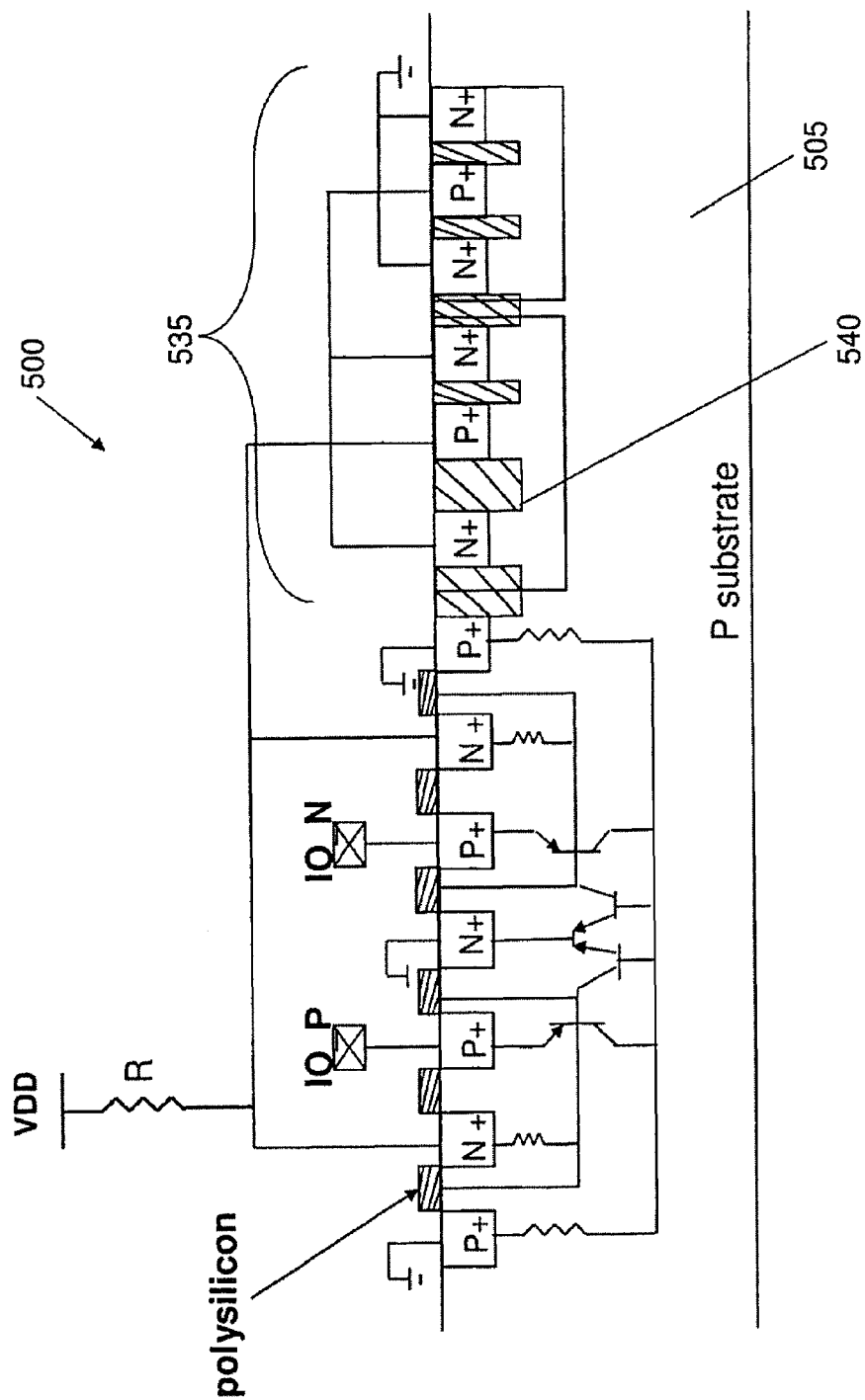
FIG. 5 shows an additional exemplary cross section view of a diode-triggered dual SCR structure according to an aspect of the invention.

FIG. 5 shows a cross section view of a diode-triggered dual SCR device with polysilicon bounded SCRs 500 according to an aspect of the invention. The embodiment of FIG. 5 is similar to that of FIG. 4, however, the adjacent P+ and N+ regions of the SCR are electrically isolated using polysilicon. Additionally, while the diode trigger 535 is shown in FIG. 5 as having STIs (similar to that of FIG. 4) it should be understood that the invention contemplates that the trigger diode 535 may be STI or polysilicon bounded.

Figure 6:
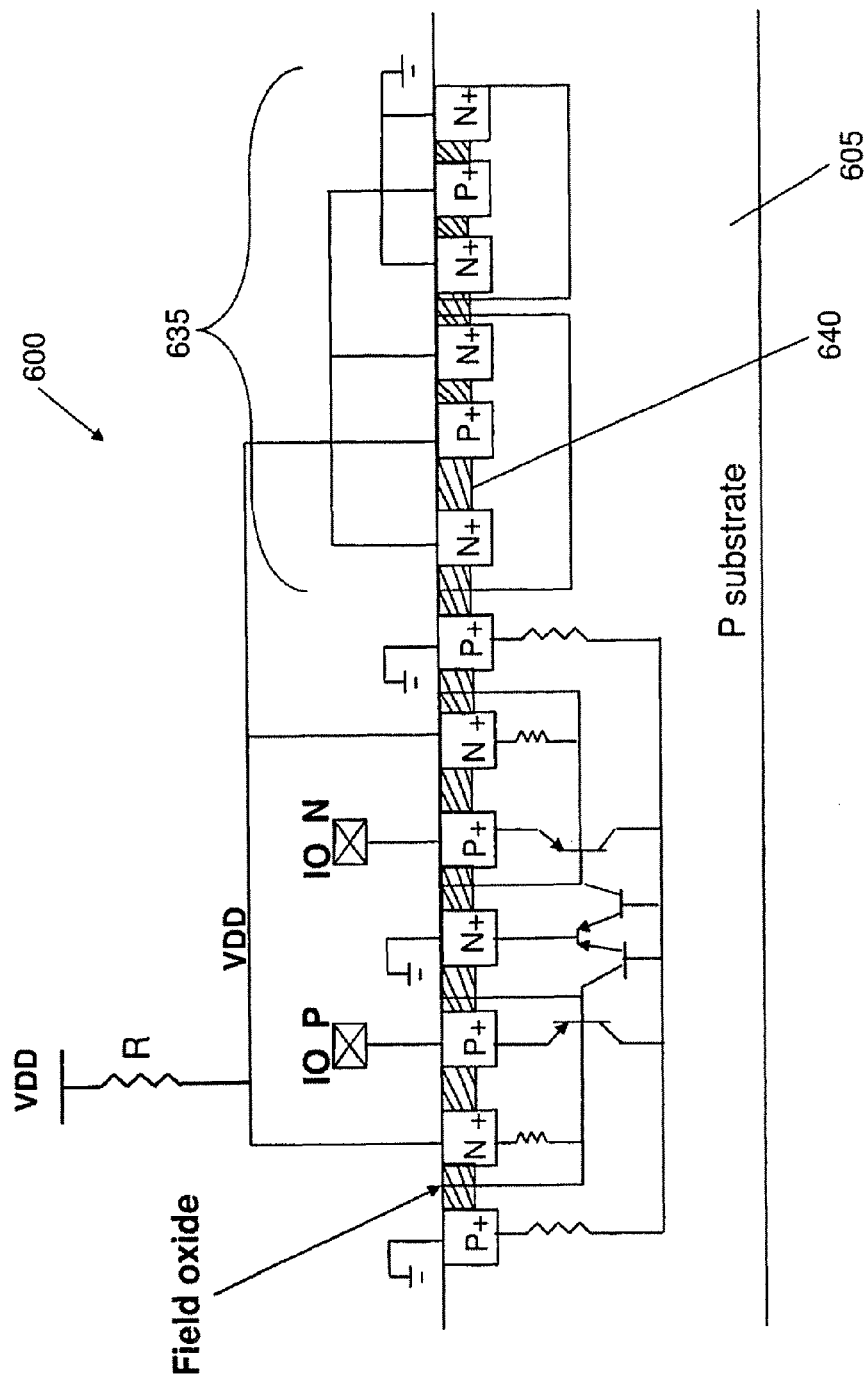
FIG. 6 shows an additional exemplary cross section view of a diode-triggered dual SCR structure according to an aspect of the invention.

FIG. 6 shows a cross section view of a diode-triggered dual SCR device with field oxide bounded SCRs 600 according to an aspect of the invention. The embodiment of FIG. 6 is similar to that of FIG. 4, however, the adjacent P+ and N+ regions of the SCR and the trigger diode are electrically isolated using field oxides. Additionally, while the diode trigger 635 is shown in FIG. 5 as having field oxides it should be understood that the invention contemplates that the trigger diode 635 may be STI or polysilicon bounded.

Figure 7:
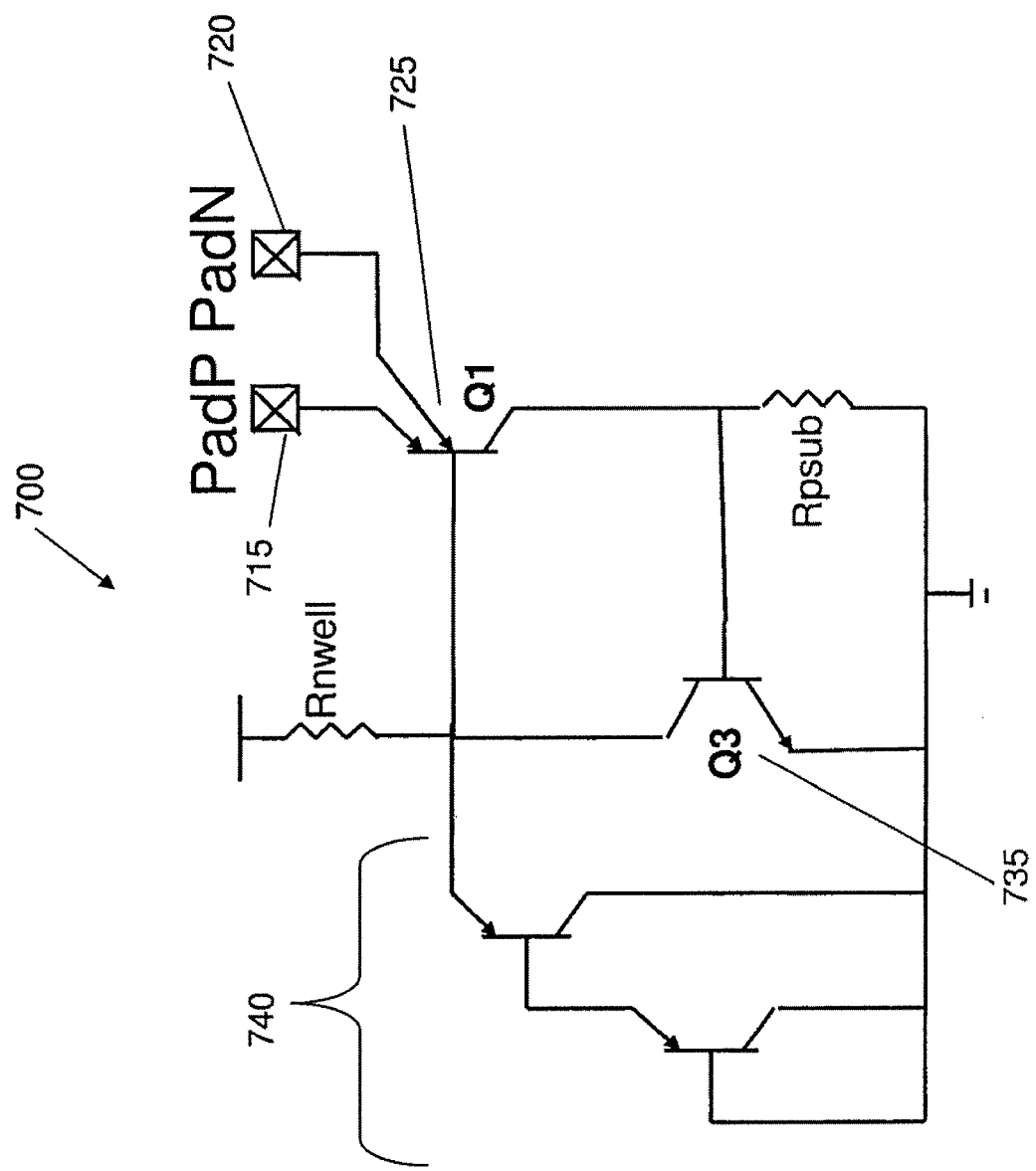
FIG. 7 shows an additional exemplary schematic of a diode-triggered dual SCR structure according to an aspect of the invention.

FIG. 7 shows a schematic of a diode-triggered dual SCR device 700 according to an aspect of the invention. As shown in FIG. 7, the diode-triggered dual SCR device 700 includes a PNP transistor 725 (Q1) and an NPN transistor 735 (Q3). Additionally, the diode-triggered dual SCR device 700 includes a trigger diode network 740 comprising, e.g., a plurality of PNP transistors. Also, the diode-triggered dual SCR device 700 includes the differential pads PadP 715 and PadN 720.

Figure 8:
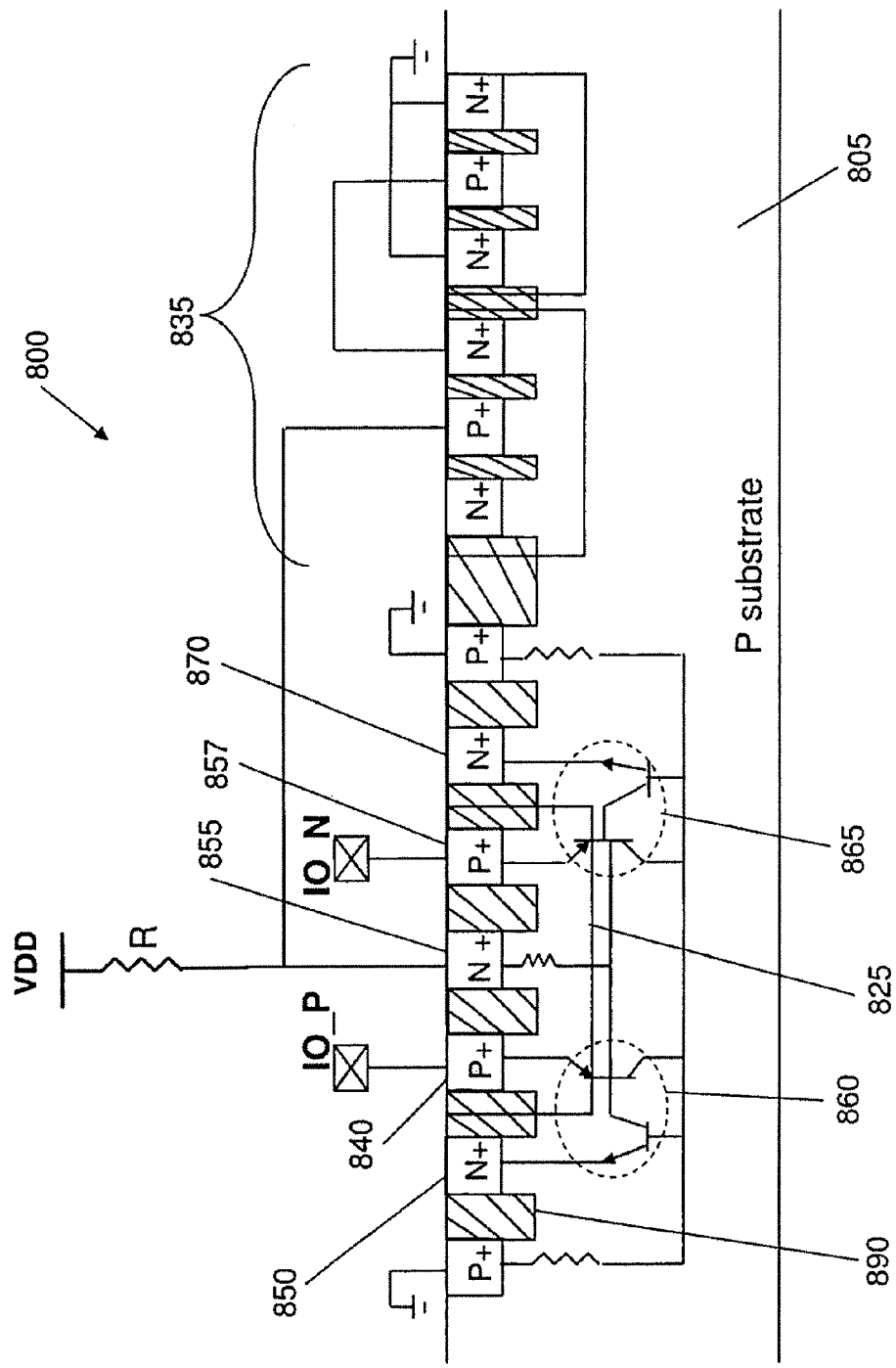
FIG. 8 shows an additional exemplary cross section view of a diode-triggered dual SCR structure according to an aspect of the invention.

FIG. 8 shows an exemplary cross section view 800 of the diode-triggered dual SCR device schematic of FIG. 7 according to an aspect of the invention. As shown in FIG. 8, a dual SCR structure 800 is formed in a lightly-doped, e.g., P-type substrate 805. A first SCR 860 includes an N-well 825 formed in the substrate 805. Moreover, an N+ region 855 and P+ region 840 are formed in the N-well 825 and an N+ region 850 is formed in the P-type substrate 805. As should be understood by one skilled in the art, the P+ region 840 (emitter), the N-well 825 (base) and the P-type substrate 805 (collector) form the PNP transistor of the first SCR 860 and the N+ region 850 (emitter), the P-type substrate 805 (base) and the N-well 825 (collector) form the NPN transistor of the first SCR 860. Thus, together the NPN transistor and the PNP transistor form the PNPN structure of the first SCR 860.

Additionally, a second SCR 865 includes the N-well 825 formed in the substrate 805. Moreover, an additional P+ region 857 is formed in the N-well 825 and an N+ region 870 is formed in the P-type substrate 805. As should be understood by one skilled in the art, the P+ region 857 (emitter), the N-well 825 (base) and the P-type substrate 805 (collector) form the PNP transistor of the second SCR 465 and the N+ region 870 (emitter), the P-type substrate 805 (base) and the N-well 825 (collector) form the NPN transistor of the second SCR 865. Thus, together the NPN transistor and the PNP transistor form the PNPN structure of the SCR 865.

A diode string 835 is also formed in the P-type substrate 805 for triggering the SCRs 860 and 865. As shown in FIG. 8, the first SCR 860 and the second SCR 865 are both electrically-connected to the diode string 835. Additionally, shallow trench isolations (STIs) 890 are formed between each of the plurality of P+ regions and N+ regions in a conventional manner to electrically isolate the adjacent regions from one another. As should be understood, the invention contemplates that SCR structure and/or the trigger diode may be polysilicon bounded or field oxide bounded.

Thus, as shown in the embodiment of FIG. 8, while the first SCR 860 and the second SCR 865 each have their own respective N+ regions (850 and 870) and P+ regions (840 and 857), the first SCR 860 and the second SCR 865 each share the same N+ region 855, the same N-well 825 and the same P-type substrate 805. Additionally, the first SCR 860 and the second SCR 865 each share the diode string 835. Thus, with the exemplary embodiment of FIG. 8, by sharing common components, a dual SCR layout may be obtained, which utilizes less device space.

Figure 9:
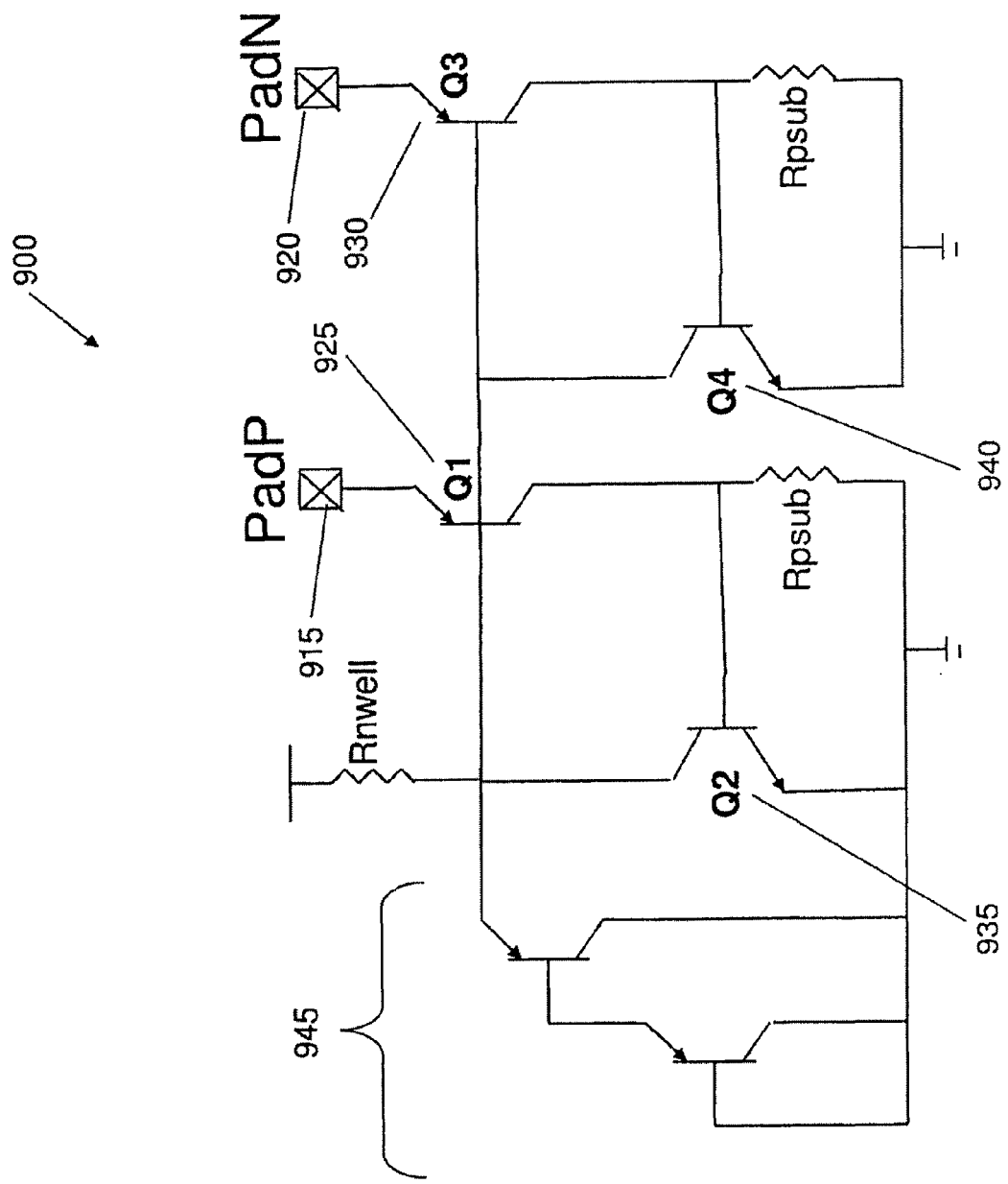
FIG. 9 shows an additional exemplary schematic of a diode-triggered dual SCR structure according to an aspect of the invention.

FIG. 9 shows a schematic of a diode-triggered dual SCR device 900 according to an aspect of the invention. As shown in FIG. 9, the diode-triggered dual SCR includes a first PNP transistor 925 (Q1), a second PNP transistor 930 (Q3) and a first NPN transistor 935 (Q2) and a second NPN transistor 940 (Q4). Additionally, the diode-triggered dual SCR device 900 includes a trigger diode network 945 comprising, e.g., a plurality of PNP transistors. Also, the diode-triggered dual SCR device 900 includes the differential pads PadP 915 and PadN 920.

Figure 10:
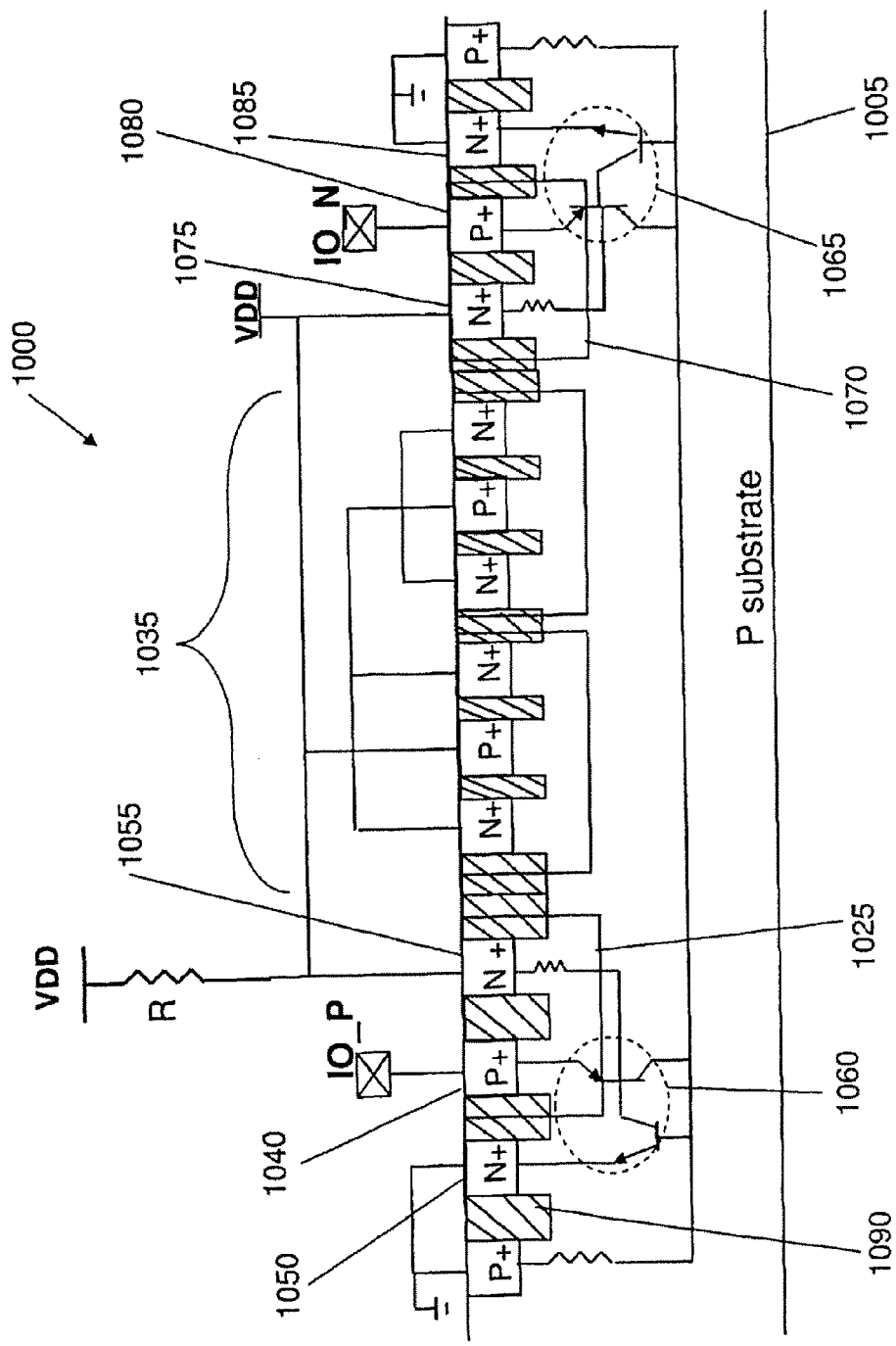
FIG. 10 shows an additional exemplary cross section view of a diode-triggered dual SCR structure according to an aspect of the invention.

FIG. 10 shows an exemplary cross section view 1000 of the diode-triggered dual SCR device schematic of FIG. 9 according to an aspect of the invention. As shown in FIG. 10, the exemplary dual SCR structure 1000 is formed in a lightly-doped, e.g., P-type substrate 1005. A first SCR 1060 includes an N-well 1025 formed in the substrate 1005. Moreover, an N+ region 1055 and P+ region 1040 are formed in the N-well 1025 and an N+ region 1050 is formed in the P-type substrate 1005. As should be understood by one skilled in the art, the P+ region 1040, the N-well 1025 and the P-type substrate 1005 form the PNP transistor of the first SCR 1060 and the N+ region 1050, the P-type substrate 1005 and the N-well 1025 form the NPN transistor of the first SCR 1060. Thus, together the NPN transistor and the PNP transistor form the PNPN structure of the first SCR 1060.

Additionally, a second SCR 1065 includes an N-well 1070 formed in the substrate 1005. Moreover, a N+ region 1075 and an P+ region 1080 are formed in the N-well 1070 and an N+ region 1085 is formed in the P-type substrate 1005. As should be understood by one skilled in the art, the P+ region 1080, the N-well 1070 and the P-type substrate 1005 form the PNP transistor of the second SCR 1065 and the N+ region 1085, the P-type substrate 1005 and the N-well 1070 form the NPN transistor of the second SCR 1065. Thus, together the NPN transistor and the PNP transistor form the PNPN structure of the SCR 1065.

A diode string 1035 is also formed in the P-type substrate 1005 for triggering the SCRs 1060 and 1065. As shown in FIG. 10, the first SCR 1060 and the second SCR 1065 are both electrically-connected to the diode string 1035 on either sides of the diode string 1035. Additionally, shallow trench isolations (STIs) 1090 are formed between each of the plurality of P+ regions and N+ regions in a conventional manner to electrically isolate the adjacent regions from one another. As should be understood, the invention contemplates that SCR structure and/or the trigger diode may be polysilicon bounded or field oxide bounded.

Thus, as shown in the embodiment of FIG. 10, the first SCR 1060 and the second SCR 1065 each share the diode string 1035. Thus, with the exemplary embodiment of FIG. 10, by sharing common components, a dual SCR layout may be obtained, which utilizes less device space.

Device Formation Process

Figure 11:
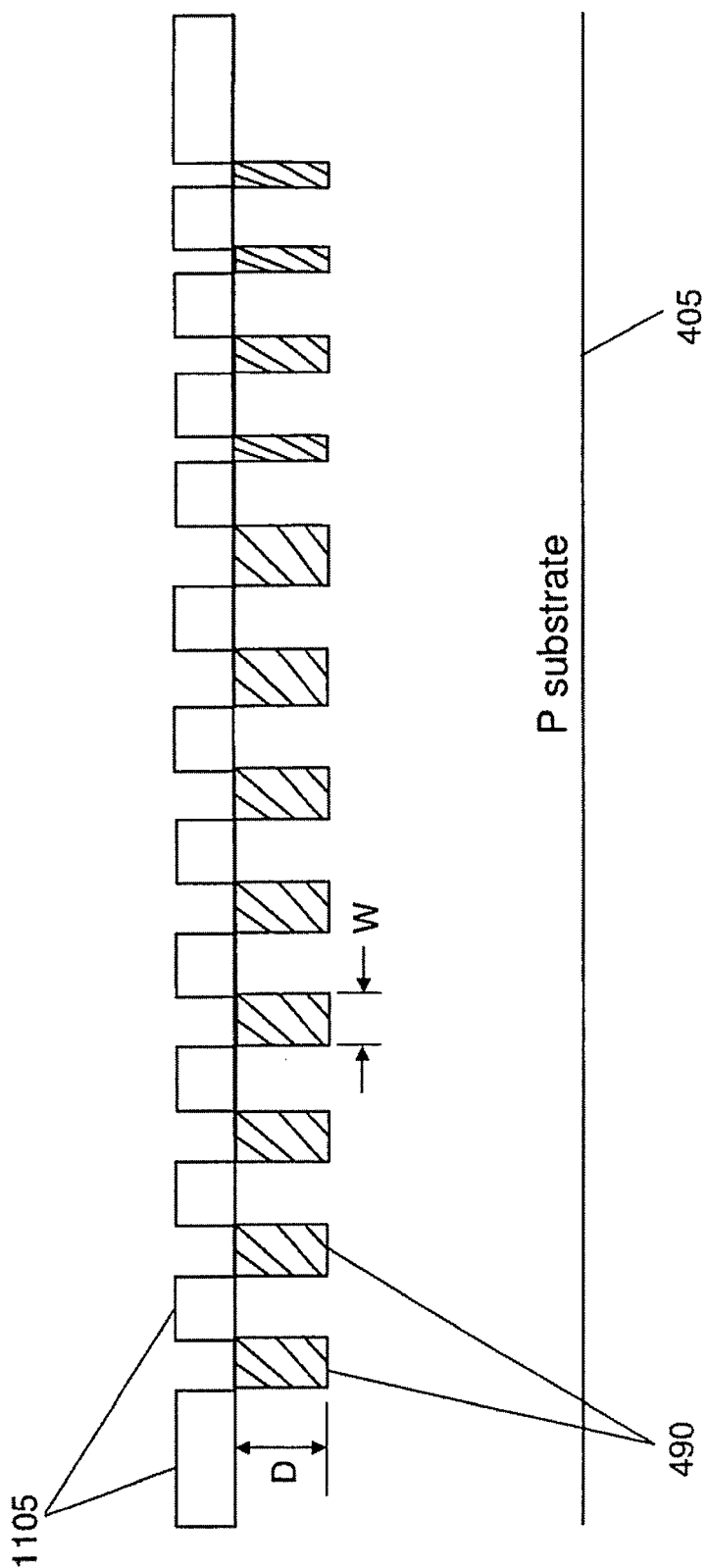
FIGS. 11-15 show process steps for forming a final structure shown in FIG. 4 in accordance with an aspect of the invention.

FIGS. 11-15 show process steps for forming a final structure shown in FIG. 4 in accordance with an aspect of the invention. Similar processes may also be used to form the final structures of FIGS. 5, 6, 8 and 10, and as such, an explanation of such process steps is not needed in order to understand the invention. FIG. 11 shows a sectional side view of a beginning structure in accordance with the invention. In embodiments, a substrate 405 may be, for example, a P-type silicon substrate. Moreover, the substrate 405 may be approximately 700-800 microns in thickness, with other thicknesses contemplated by the invention.

As shown in FIG. 11, a photolithographic masking layer 1105 may be formed over the substrate 405 with holes formed therein in a conventional lithographic process. Trenches may be provided in the substrate by locally etching into the substrate 405 in a conventional manner, e.g., a reactive ion etch (RIE). As such, a description of the masking and etching processes are not necessary for a person of ordinary skill in the art to practice these particular steps. Additionally, an insulator material, e.g., silicon dioxide ($SiO_2$), is illustratively deposited to form the STIs 490, and the surface is then planarized in a conventional manner, e.g., using a chemical-mechanical polish (CMP). As such, a description of the deposition and planarization processes are not necessary for a person of ordinary skill in the art to practice these particular steps. In embodiments, the STIs 490 may be 0.15-1.0 μm in width (W), with other widths contemplated by the invention. Moreover, the STIs 490 may all be of equal widths, or the respective widths of the STIs may vary. Additionally, in embodiments, the depth (D) of the STIs may be between approximately 0.3 μm and 0.75 μm, although other dimensions are contemplated by the invention.

Figure 12:
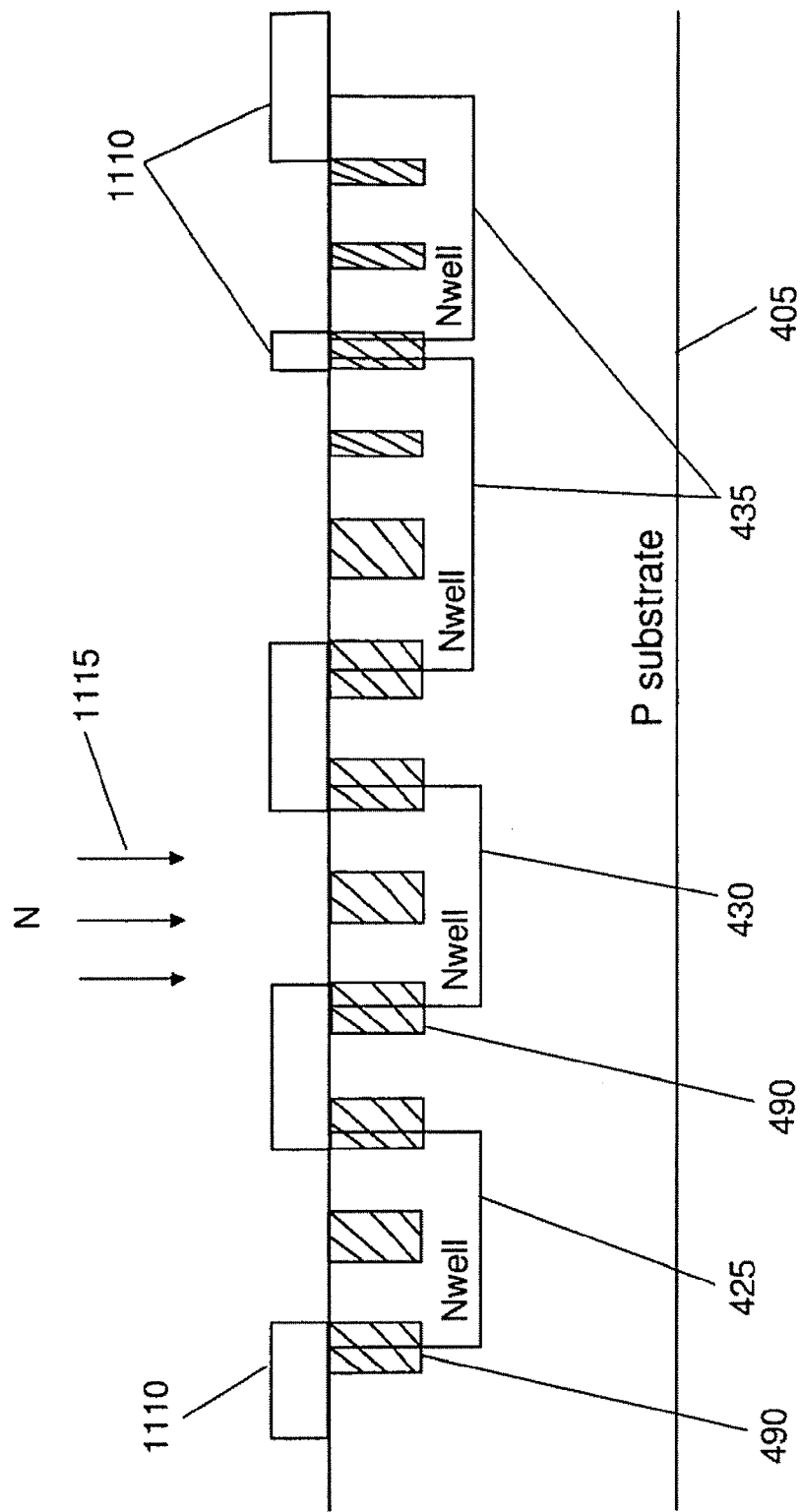

FIG. 12 shows the structure after further processing steps. As shown in FIG. 12, the mask layer 1105 may be removed and a mask layer 1110 may be formed in select areas on the top of the substrate 405. In embodiments, the mask layer 1110 may be formed, for example, by a conventional photolithography masking process. As such, a description of the masking process is not necessary for a person of ordinary skill in the art to practice this particular step. Additionally, as shown in FIG. 12, the exposed regions of the substrate 405 may be lightly implanted with a n-type dopant 1115, e.g., As, to form the N-wells 425, 430 and 435. In embodiments, the N-wells may be doped with a doping concentration on the order of approximately 1e14-1e18 $cm^{-3}$, with other doping concentrations contemplated by the invention. Additionally, in embodiments, the depth of the N-wells 425, 430 and 435 may be approximately 2 μm, although other dimensions are contemplated by the invention.

Figure 13:
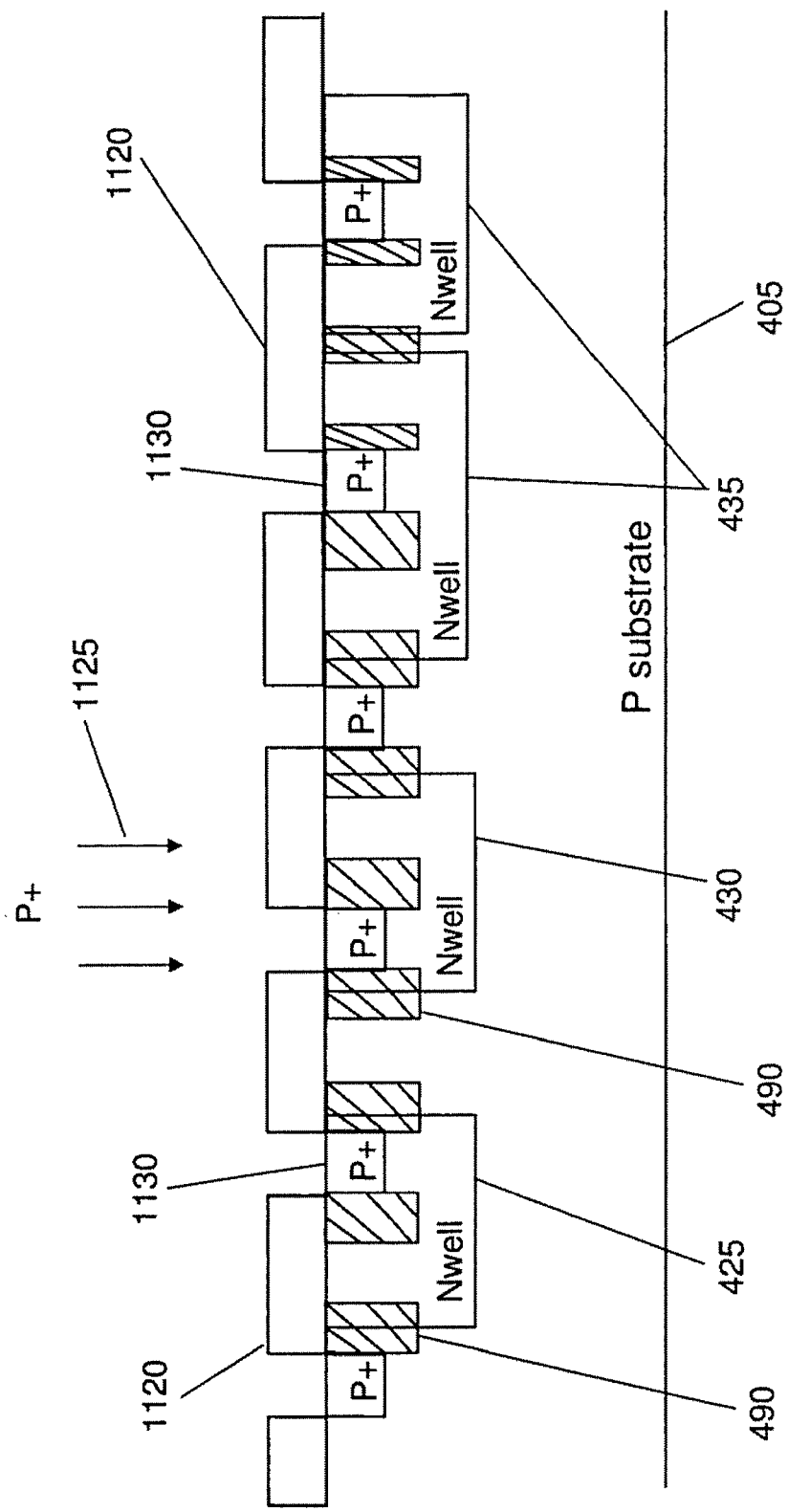

As shown in FIG. 13, the mask layer 1110 may be removed and a mask layer 1120 may be formed in select areas on the top of the substrate 405 to protect the regions of the substrate 405 that are not to be implanted with a p-type dopant 1125. In embodiments, the mask layer 1120 may be formed, for example, by a conventional photolithography masking process. As such, a description of the masking process is not necessary for a person of ordinary skill in the art to practice this particular step. Additionally, as shown in FIG. 13, the exposed regions of the substrate 405 may be implanted with the p-type dopant 1125, e.g., $BF_2$, to form the P+ regions 1130. In embodiments, the P+ regions 1130 may be doped with a doping concentration on the order of approximately 1e19-1e21 $cm^{-3}$, with other doping concentrations contemplated by the invention. In embodiments, the width of the P+ regions 1130 may be between approximately 0.24 μm and 1.5 μm, although other dimensions are contemplated by the invention. Additionally, in embodiments, the depth of the P+ regions 1130 may be between approximately 0.1 μm and 0.25 μm, although other dimensions are contemplated by the invention.

Figure 14:
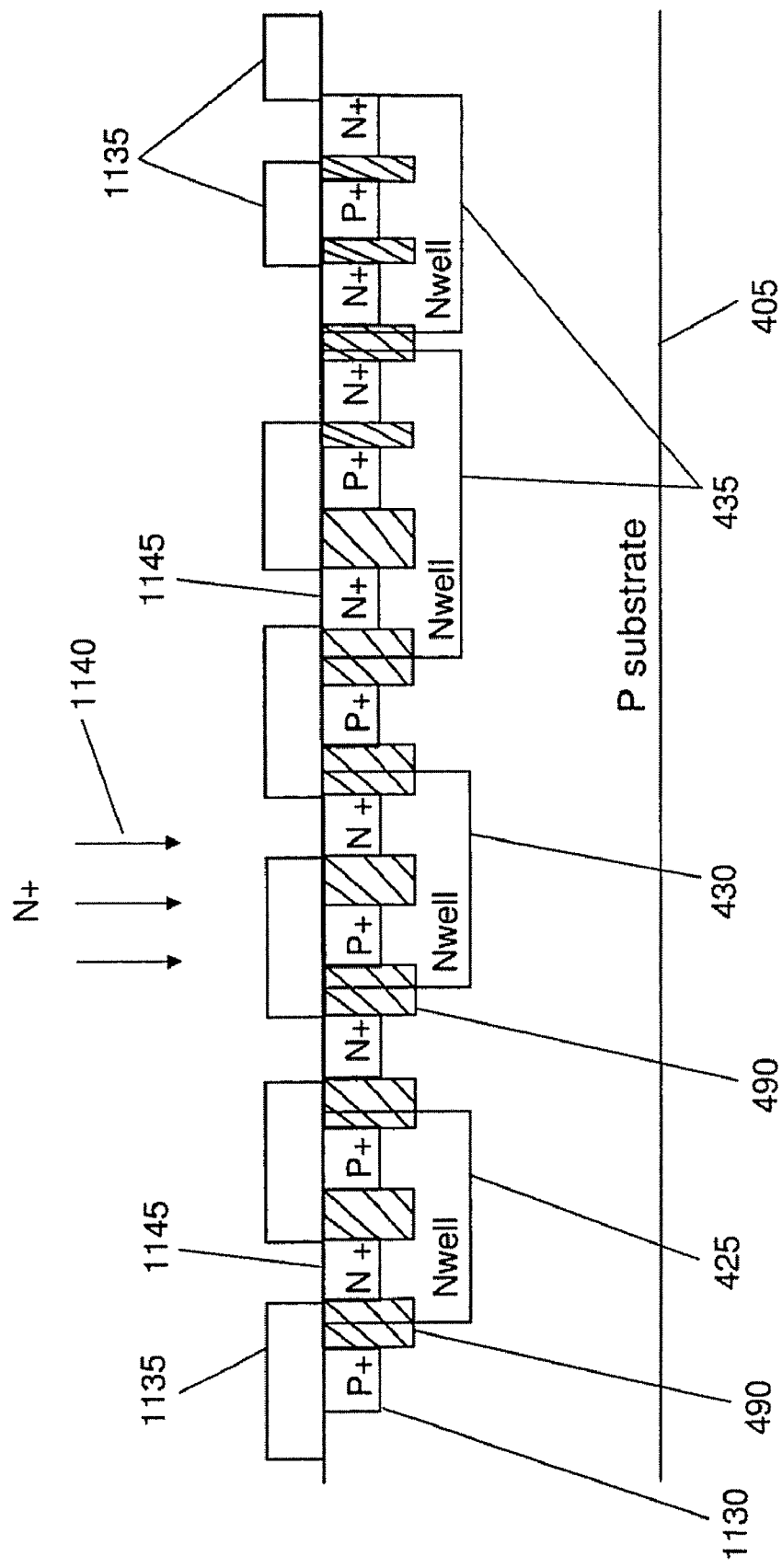

As shown in FIG. 14, the mask layer 1120 may be removed and a mask layer 1135 may be formed in select areas on the top of the substrate 405 to protect the regions of the substrate 405 that are not to be implanted with an n-type dopant 1140. In embodiments, the mask layer 1135 may be formed, for example, by a conventional photolithography masking process. As such, a description of the masking process is not necessary for a person of ordinary skill in the art to practice this particular step. The exposed regions of the substrate 405 may be implanted with the n-type dopant 1140, e.g., As, to form the N+ regions 1145. In embodiments, the N+ regions 1145 may be doped with a doping concentration on the order of approximately 1e19-1e21 $cm^{-3}$, with other doping concentrations contemplated by the invention. In embodiments, the width of the N+ regions 1145 may be between approximately 0.24 μm and 1.5 μm, although other dimensions are contemplated by the invention. Additionally, in embodiments, the depth of the N+ regions 1145 may be between approximately 0.1 μm and 0.25 μm, although other dimensions are contemplated by the invention.

Figure 15:
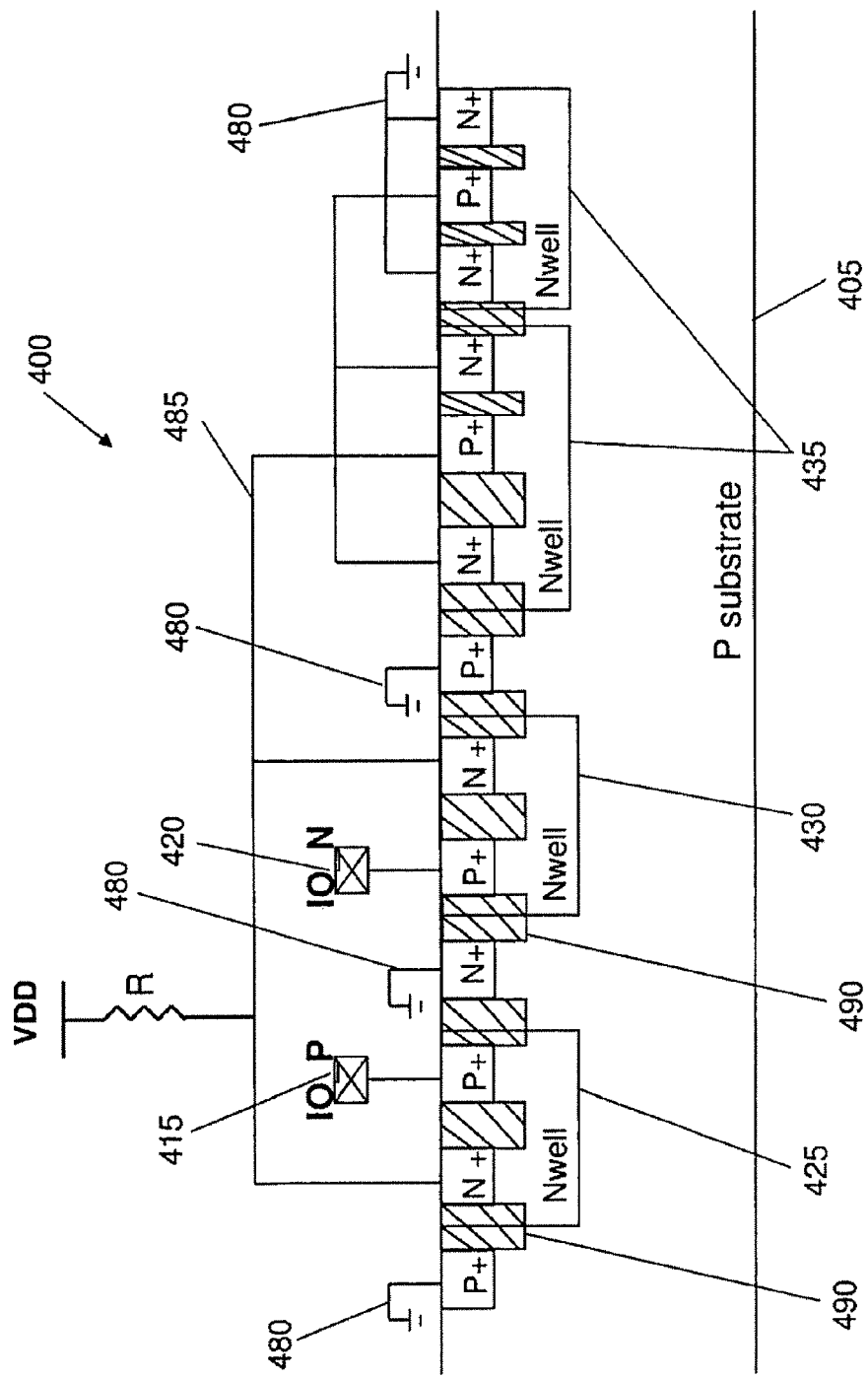

FIG. 15 shows a final structure of a diode trigger dual SCR device 400 without the overlaid circuit schematics (as shown in FIG. 4) after further processing steps. As shown in FIG. 15, the mask layer 1135 may be removed and the input/output pads 415 and 420 may be connected to the diode trigger dual SCR device 400. Additionally, ground connections 480 and connections 485 to the diode string may be formed in a conventional manner. As such, a description of the connection formation processes are not necessary for a person of ordinary skill in the art to practice these particular steps.

Design Flow

Figure 16:
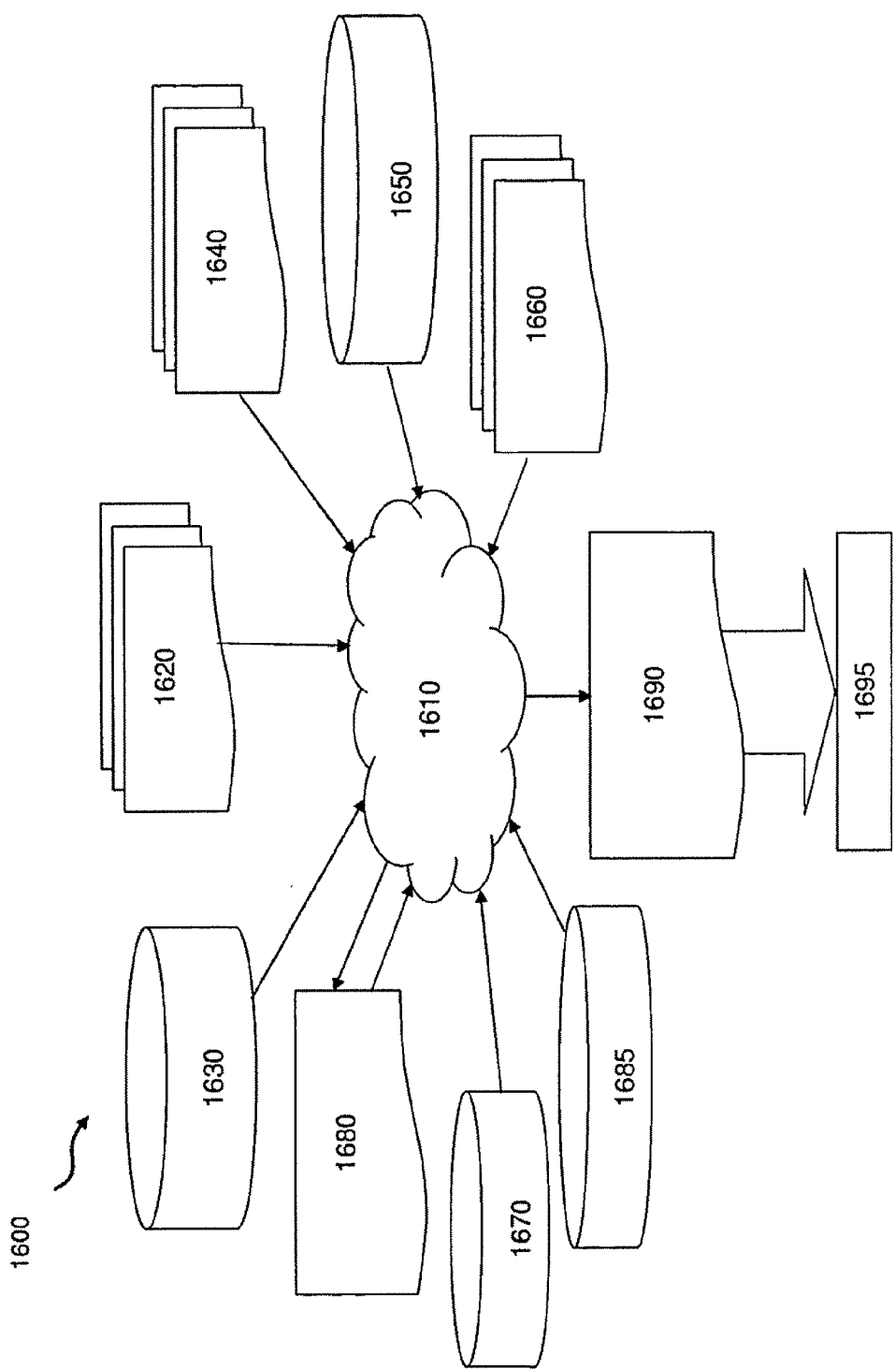
FIG. 16 is a flow diagram of a design process used in semiconductor design, manufacturing, and/or testing.

FIG. 16 shows a block diagram of an exemplary design flow 1600 used for example, in semiconductor design, manufacturing, and/or test. Design flow 1600 may vary depending on the type of IC being designed. For example, a design flow 1600 for building an application specific IC (ASIC) may differ from a design flow 1600 for designing a standard component or from a design from 1600 for instantiating the design into a programmable array, for example a programmable gate array (PGA) or a field programmable gate array (FPGA) offered by Altera® Inc. or Xilinx® Inc. (Altera is a registered trademark of Altera Corporation in the United States, other countries, or both. Xilinx is a registered trademark of Xilinx, Inc. in the United States, other countries, or both.) Design structure 1620 is preferably an input to a design process 1610 and may come from an IP provider, a core developer, or other design company or may be generated by the operator of the design flow, or from other sources. Design structure 1620 comprises an embodiment of the invention as shown in FIGS. 4-6, 8 and 10 in the form of schematics or HDL, a hardware-description language (e.g., VERILOG®, Very High Speed Integrated Circuit (VHSIC) Hardware Description Language (VHDL), C, etc.). (VERILOG is a registered trademark of Cadence Design Systems, Inc. in the United States, other countries, or both.) Design structure 1620 may be contained on one or more machine readable medium. For example, design structure 1620 may be a text file or a graphical representation of an embodiment of the invention as shown in FIGS. 4-6, 8 and 10. Design process 1610 preferably synthesizes (or translates) an embodiment of the invention as shown in FIGS. 4-6, 8 and 10 into a netlist 1680, where netlist 1680 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 1680 is resynthesized one or more times depending on design specifications and parameters for the circuit.

Design process 1610 may include using a variety of inputs; for example, inputs from library elements 1630 which may house a set of commonly used elements, circuits, and devices, including models, layouts, and symbolic representations, for a given manufacturing technology (e.g., different technology nodes, 32 nm, 45 nm, 90 nm, etc.), design specifications 1640, characterization data 1650, verification data 1660, design rules 1670, and test data files 1685 (which may include test patterns and other testing information). Design process 1610 may further include, for example, standard circuit design processes such as timing analysis, verification, design rule checking, place and route operations, etc. One of ordinary skill in the art of integrated circuit design can appreciate the extent of possible electronic design automation tools and applications used in design process 1610 without deviating from the scope and spirit of the invention. The design structure of the invention is not limited to any specific design flow.

Design process 1610 preferably translates an embodiment of the invention as shown in FIGS. 4-6, 8 and 10, along with any additional integrated circuit design or data (if applicable), into a second design structure 1690. Design structure 1690 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 1690 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 4-6, 8 and 10. Design structure 1690 may then proceed to a stage 1695 where, for example, design structure 1690: proceeds to tape-out, is released to manufacturing, is released to a mask house, is sent to another design house, is sent back to the customer, etc.

While the invention has been described in terms of embodiments, those of skill in the art will recognize that the invention can be practiced with modifications and in the spirit and scope of the appended claims.

What is claimed is:

1. A bi-directional electrostatic discharge (ESD) structure comprising:
   first and second silicon controlled rectifiers (SCRs) formed in a substrate, wherein the first and the second SCRs each comprise at least one component commonly shared between the first and the second SCRs, wherein the at least one commonly shared component comprises an NPN collector.

2. The structure of claim 1, wherein the at least one commonly shared component further comprises a trigger network.

3. The structure of claim 1, wherein the at least one commonly shared component comprises a PNP base.

4. The structure of claim 3, wherein the at least one commonly shared component further comprises a trigger network.

* * * * *